(12) United States Patent
Liu

(10) Patent No.: US 10,816,409 B1
(45) Date of Patent: Oct. 27, 2020

(54) TEMPERATURE SENSING DEVICE AND SERVER

(71) Applicants: INVENTEC (PUDONG) TECHNOLOGY CORPORATION, Shanghai (CN); INVENTEC CORPORATION, Taipei (TW)

(72) Inventor: Jian-Fei Liu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/794,042

(22) Filed: Feb. 18, 2020

(30) Foreign Application Priority Data

Oct. 29, 2019 (CN) .......................... 2019 1 1038180

(51) Int. Cl.
*G01K 1/02* (2006.01)
*G01D 21/02* (2006.01)
*H05K 7/20* (2006.01)

(52) U.S. Cl.
CPC ............. *G01K 1/026* (2013.01); *G01D 21/02* (2013.01); *H05K 7/20709* (2013.01)

(58) Field of Classification Search
CPC combination set(s) only.
See application file for complete search history.

(56) References Cited

U.S. PATENT DOCUMENTS

| 5,526,289 | A | * | 6/1996 | Dinh | G06F 1/206 |
| | | | | | 361/679.02 |
| 6,853,546 | B2 | * | 2/2005 | Rabinovitz | G06F 1/184 |
| | | | | | 248/682 |
| 9,189,245 | B2 | * | 11/2015 | Sun | G06F 1/184 |
| 10,203,734 | B2 | * | 2/2019 | Liu | G06F 1/3246 |
| 10,658,878 | B2 | * | 5/2020 | Smith | H02J 50/12 |
| 10,732,054 | B2 | * | 8/2020 | Calhoun, Jr. | G01K 3/005 |
| 2011/0279168 | A1 | * | 11/2011 | Lee | G11C 7/04 |
| | | | | | 327/512 |
| 2015/0056908 | A1 | * | 2/2015 | Chapel | G06F 1/20 |
| | | | | | 454/184 |
| 2019/0195695 | A1 | * | 6/2019 | Millhouse | G08B 13/14 |

\* cited by examiner

*Primary Examiner* — Lisa Lea-Edmonds
(74) *Attorney, Agent, or Firm* — Maschoff Brennan

(57) ABSTRACT

The present disclosure provides a temperature-sensing device and a server, with the server including a chassis and a mainboard. A temperature-sensitive element is disposed at an inlet of the chassis, and the temperature-sensitive element is used for converting a temperature sensed in the inlet of the chassis to a temperature sensing data. The mainboard is disposed in the chassis and includes a temperature sensor and a host. An external temperature-sensing channel of the temperature sensor is communicatively connected to the temperature-sensitive element for transferring the temperature sensing data to the host. The function of sensing the temperature in the inlet of the chassis of the server can be implemented by the temperature sensing device and the server disclosed in the present disclosure, which reducing the product manufacturing costs. There is no need to test I²C signals on a temperature-sensor board, which reducing labor costs.

10 Claims, 4 Drawing Sheets

TEMPERATURE SENSING DEVICE AND SERVER

CROSS-REFERENCE TO RELATED APPLICATIONS

This non-provisional application claims priority under 35 U.S.C. § 119(a) on Patent Application No(s). 201911038180.1 filed in China on Oct. 29, 2019, the entire contents of which are hereby incorporated by reference.

BACKGROUND

1. Technical Field

The present disclosure is related to the field of temperature testing techniques and involved in a device, more particularly involved in a temperature sensing device and a server.

2. Related Art

Computer equipment has been widely used, but environments of utilization are quite different. For some customers such as customers of schools, small businesses, subways, coal mines, the demands for servers are less or environments of server rooms are poor. Since the uses of some servers are less, the cost for setting those servers in standard server rooms would be high. Moreover, some industrial customers engaging in subway constructions or mineral developments do not provide standard server rooms for setting up their servers. The servers bought by those industrial customers are disposed in poor environments instead of disposing in the standard server rooms which meet the standards of temperature, humidity and dust. As a result, a significant amount of dust gathers at the front board of the servers due to a long-term use, especially at the inlets of the chassis on the front board of the servers. If the amount of dust gathering at the inlets of the chassis is huge, the efficiency of the air inlet becomes low and the heat dissipation of the servers are poor, resulting in the problems of overheating of the servers and unexpectable crashes of servers. Those problems negatively affect the running of customer business and decrease the life span of the servers.

In order to obtain temperature at an inlet of a server, traditionally, a piece of separate temperature sensor board is placed at the inlet of the server. The piece of temperature sensor board is connected to a mainboard of the server in form of cables for implementing this function of obtaining the temperature. However, in the traditional technique, the manufacturing costs of products are increased. Moreover, the labor costs are increased because of the problem of signal incompletion which requires testing of technician.

Therefore, providing a temperature sensing device and a server to solve the defects of increasing manufacturing costs and labor costs in the conventional technique has become an important issue to be addressed by people in the field.

SUMMARY

In view of the above defects of the conventional technique, the purpose of the present disclosure is to provide a temperature sensing device and a server for solving the problems of increasing product manufacturing costs and labor costs in the conventional technique.

For achieving the above-mentioned object and other relative objects, a temperature sensing device used for sensing temperature at an inlet of a chassis is provided according to one aspect of the present disclosure. The temperature sensing device includes: a temperature sensor disposed on a mainboard in the chassis; a temperature-sensitive element disposed at the inlet of the chassis and communicatively connected to an external temperature-sensing channel of the temperature sensor, with temperature-sensitive element configured to convert the temperature sensed at the inlet of the chassis to temperature sensing data and send the temperature sensing data to the temperature sensor.

In one embodiment of the present disclosure, the temperature-sensitive element is communicatively connected to the external temperature-sensing channel of the temperature sensor through cables.

In one embodiment of the present disclosure, the external temperature-sensing channel of the temperature sensor includes a positive electrode interface and a negative electrode interface.

In one embodiment of the present disclosure, the temperature-sensitive element includes a temperature-sensitive triode; a collector of the temperature-sensitive triode is grounded; an emitter of the temperature-sensitive triode is communicatively connected to the positive electrode interface; a base of the temperature-sensitive triode is communicatively connected to the negative electrode interface.

In one embodiment of the present disclosure, the cables include an anode signal line and a cathode signal line; the emitter of the temperature-sensitive triode is connected to the positive electrode interface of the external temperature-sensing channel through the anode signal line; the base of the temperature-sensitive triode is connected to the negative electrode interface of the external temperature-sensing channel through the cathode signal line.

In one embodiment of the present disclosure, the temperature sensor obtains the temperature sensing data by detecting a voltage difference between the positive electrode interface and the negative electrode interface and converts the temperature sensing data to binary data.

A server is provided according to another aspect of the present disclosure. The server includes: a chassis; with a temperature-sensitive element disposed at an inlet of the chassis, the temperature-sensitive element configured to convert temperature sensed at the inlet of the chassis to temperature sensing data; a mainboard disposed in the chassis; with the mainboard including a temperature sensor and a host system; an external temperature-sensing channel of the temperature sensor is communicatively connected to the temperature-sensitive element for transferring the temperature sensing data to the host system.

In one embodiment of the present disclosure, the temperature-sensitive element is communicatively connected to the external temperature-sensing channel of the temperature sensor through cables; the external temperature-sensing channel of the temperature sensor includes a positive electrode interface and a negative electrode interface; the cables include an anode signal line and a cathode signal line; the temperature-sensitive element includes a temperature-sensitive triode; an emitter of the temperature-sensitive triode is connected to the positive electrode interface of the external temperature-sensing channel through the anode signal line; a base of the temperature-sensitive triode is connected to the cathode of the external temperature-sensing channel through the cathode signal line.

In one embodiment of the present disclosure, the temperature sensor obtains the temperature sensing data by detecting a voltage difference between the positive electrode interface and the negative electrode interface and converts the temperature sensing data to binary data.

In one embodiment of the present disclosure, the host system is communicatively connected to the temperature sensor via an I2C interface for analyzing the binary data to obtain a temperature value of the inlet of the chassis.

As described above, the temperature sensing device and the server disclosed in the present disclosure have the following beneficial effects:

In the temperature sensing device and the server of the present disclosure, the temperature sensor is disposed on the mainboard. With the external temperature-sensing channel of the temperature sensor, a temperature-sensitive triode is externally connected to the external temperature-sensing channel by using cables, and further the temperature-sensitive triode is disposed at the inlet of the chassis. Thereby, the function of sensing temperature at an inlet of a server chassis can be achieved, so that the product manufacturing costs are reduced. Furthermore, it is not necessary to test I$^2$C signals on a temperature sensor board, so that the labor costs are reduced.

DETAILED DESCRIPTION

The embodiments of the present disclosure are illustrated by specific embodiments below, and persons skilled in the art are able to easily understand other advantages and effects of the present disclosure from the disclosure of the specification.

It is to be realized that the structures, the proportions, the sizes and the like, which are illustrated in drawings of the specification, are merely used in conjunction with the disclosure of the specification for understanding and reading by those skilled in the art, but are not intended to limit the present disclosure, therefore, not technically meaningful. Any modification of structure, change of proportional relationship or adjustment of size which are made without affecting the effects and the purposes of the present disclosure, should be within the scope of the present disclosure. Meanwhile, the terms "upper", "lower", "left", "right", "middle" and "one" as mentioned in the specification are merely used for convenience of description, but not intended to limit the scope of embodiments of the present disclosure. The change or adjustment of the relative relationship, which is made without changing the technical contents, should be considered as being within the scope of the present disclosure.

A temperature sensing device and a server disclosed in the present disclosure have following technical principles:

In the present disclosure, a temperature sensor is disposed on a mainboard. With an external temperature-sensing channel of the temperature sensor, a temperature-sensitive triode is disposed at an inlet of a chassis and connected to the external temperature-sensing channel of the temperature sensor on the mainboard through cables, so that the function of obtaining the temperature of the inlet of the chassis of the server could be achieved. The above technique disclosed in the present disclosure substitutes for the conventional technique of using a temperature-sensor board.

Embodiment I

The embodiment provides a temperature sensing device which is adapted to sense temperature at an inlet of a chassis; the temperature sensing device includes:

a temperature sensor disposed on a mainboard in the chassis;

a temperature-sensitive element disposed at the inlet of the chassis and communicatively connected to an external temperature-sensing channel of the temperature sensor, with the temperature-sensitive element is configured to convert the temperature sensed at the inlet of the chassis to temperature sensing data and send the temperature sensing data to the temperature sensor.

Figure 1:
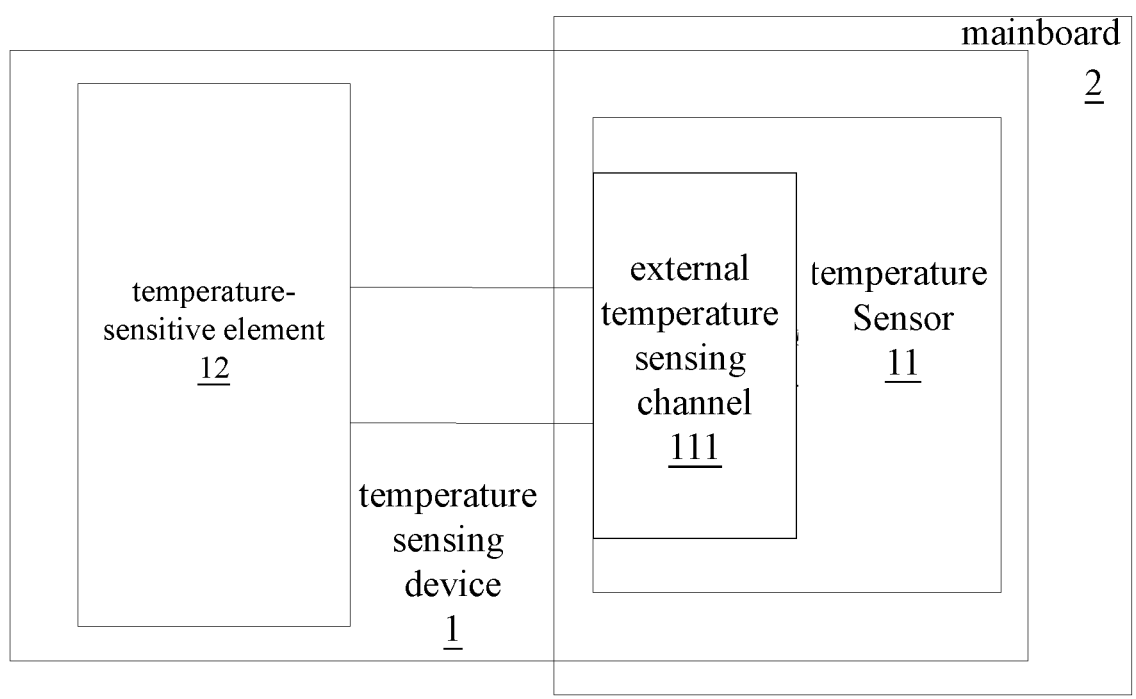
FIG. 1 is a principle structural diagram of a temperature sensing device according to one embodiment of the present disclosure.
Figure 2:
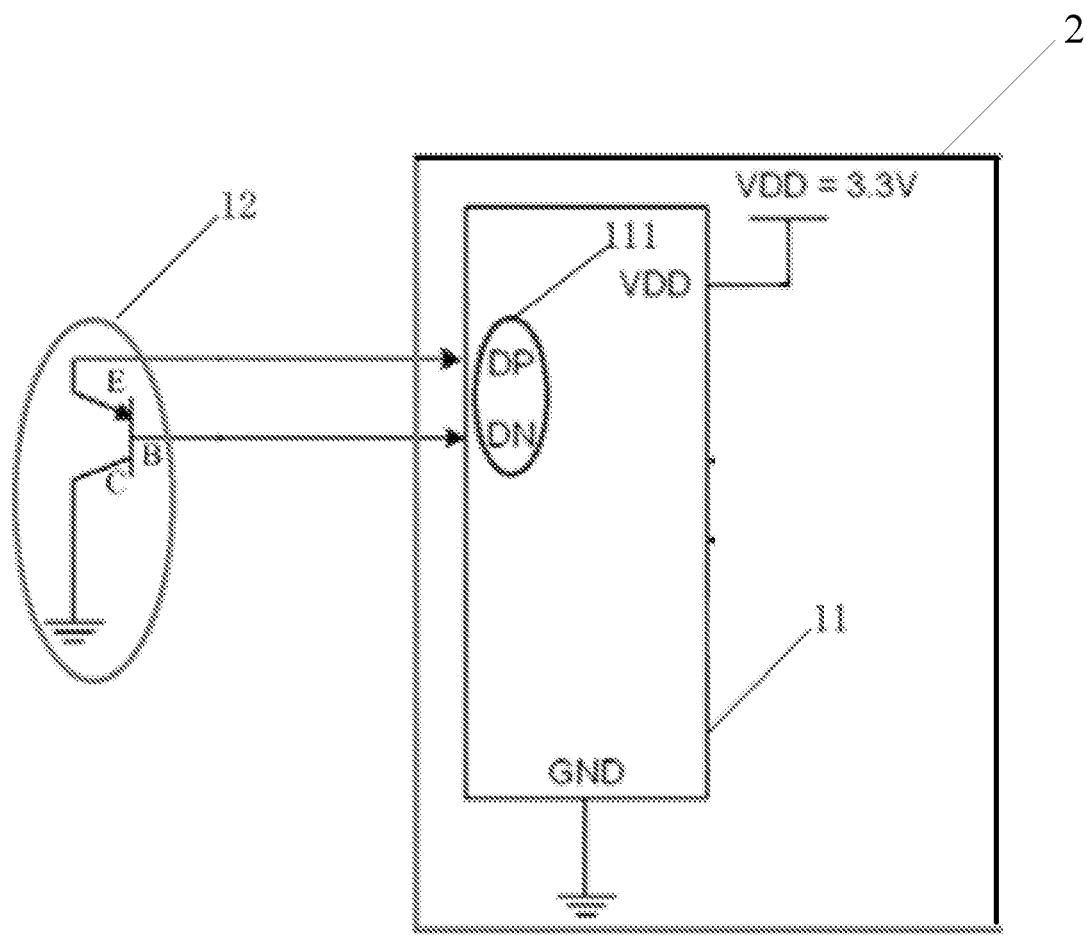
FIG. 2 is an implementation structural diagram of a temperature sensing device according to one embodiment of the present disclosure.

The temperature sensing device disclosed in this embodiment will be described in detail below with reference to drawings. The temperature sensing device in this embodiment is configured to sense temperature at the inlet of the chassis. Please refer to FIG. 1 and FIG. 2. FIG. 1 is a principle structural diagram of a temperature sensing device according to one embodiment of the present disclosure and FIG. 2 is an implementation structural diagram of a temperature sensing device according to one embodiment of the present disclosure. As shown in FIG. 1, a temperature sensing device 1 includes a temperature sensor 11 and a temperature-sensitive element 12.

The temperature sensor 11 is disposed on a mainboard 2 in a chassis. As shown in FIG. 1 and FIG. 2, an external temperature-sensing channel 111 is disposed in the temperature sensor 11. The external temperature-sensing channel 111 of the temperature sensor 11 includes a positive electrode interface DP and a negative electrode interface DN. The temperature sensor 11 further includes a power terminal VDD and a ground terminal GND. The power terminal VDD receives power which is provided by the mainboard 2 for the temperature sensor 11 (e.g. 3.3V).

The temperature-sensitive element 12 disposed at the inlet of the chassis is communicatively connected to the external temperature-sensing channel 111 of the temperature sensor 11. Specifically, the temperature-sensitive element 12 is communicatively connected to the external temperature-sensing channel of the temperature sensor through cables. The cables include an anode signal line and a cathode signal line.

Please continue to refer to FIG. 2, the temperature-sensitive element 12 includes a temperature-sensitive triode. The embodiment is based on the principle that the forward voltage Ube of the emitter junction of the triode is decreasing with the increasing temperature. Although the emitter current includes three current components including a diffusion current, a combination current of space charges and a surface combination current when a forward bias is applied to the emitter junction, only the diffusion current can reach the collector for forming collector Ic while the other two currents would be leaked as base currents. Therefore, the relationship of Ic-Ube of the transistor could show a better voltage-temperature linear relationship.

In this embodiment, the connection of the temperature sensing device 1 is shown below:

A collector C of the temperature-sensitive triode is grounded.

An emitter E of the temperature-sensitive triode is communicatively connected to the positive electrode interface DP. Specifically, the emitter E of the temperature-sensitive triode is connected to the positive electrode interface DP of the external temperature-sensing channel through the anode signal line.

A base B of the temperature-sensitive triode is communicatively connected to the negative electrode interface DN. Specifically, the base B of the temperature-sensitive triode is connected to the negative electrode interface DN of the external temperature-sensing channel through the cathode signal line.

The process which the temperature sensing device 1 senses temperature data is shown below:

The temperature-sensitive element 12 converts the temperature sensed at the inlet of the chassis to temperature sensing data, and further sends the temperature sensing data to the temperature sensor 11. The temperature sensor 11 obtains the temperature sensing data by detecting a voltage difference between the positive electrode interface DP and the negative electrode interface DN and converts the temperature sensing data to binary data.

For example, the temperature-sensitive element 12 senses that the temperature at the inlet of the chassis is X degree, and the temperature X degree corresponds to a voltage difference Y between the positive electrode interface DP and the negative electrode interface DN. After the temperature sensor 11 detects the presence of the voltage difference Y, the temperature sensor 11 converts the voltage difference Y to the binary data.

In this embodiment, the temperature sensing device connects the temperature-sensitive element to the external temperature-sensing interface of the temperature sensor on the mainboard by cables, so as to achieve the function of obtaining the temperature at the inlet of the server chassis, which is used to substitute for the conventional use of a temperature-sensor board and reducing the manufacturing costs.

Embodiment II

This embodiment provides a server, and the server includes:

a chassis; a temperature-sensitive element is disposed at an inlet of the chassis, and the temperature-sensitive element is configured to convert temperature sensed at the inlet of the chassis to temperature sensing data;

a mainboard disposed in the chassis; the mainboard includes a temperature sensor and a host system; an external temperature-sensing channel of the temperature sensor is communicatively connected to the temperature-sensitive element and configured to transfer the temperature sensing data to the host system.

Figure 3:
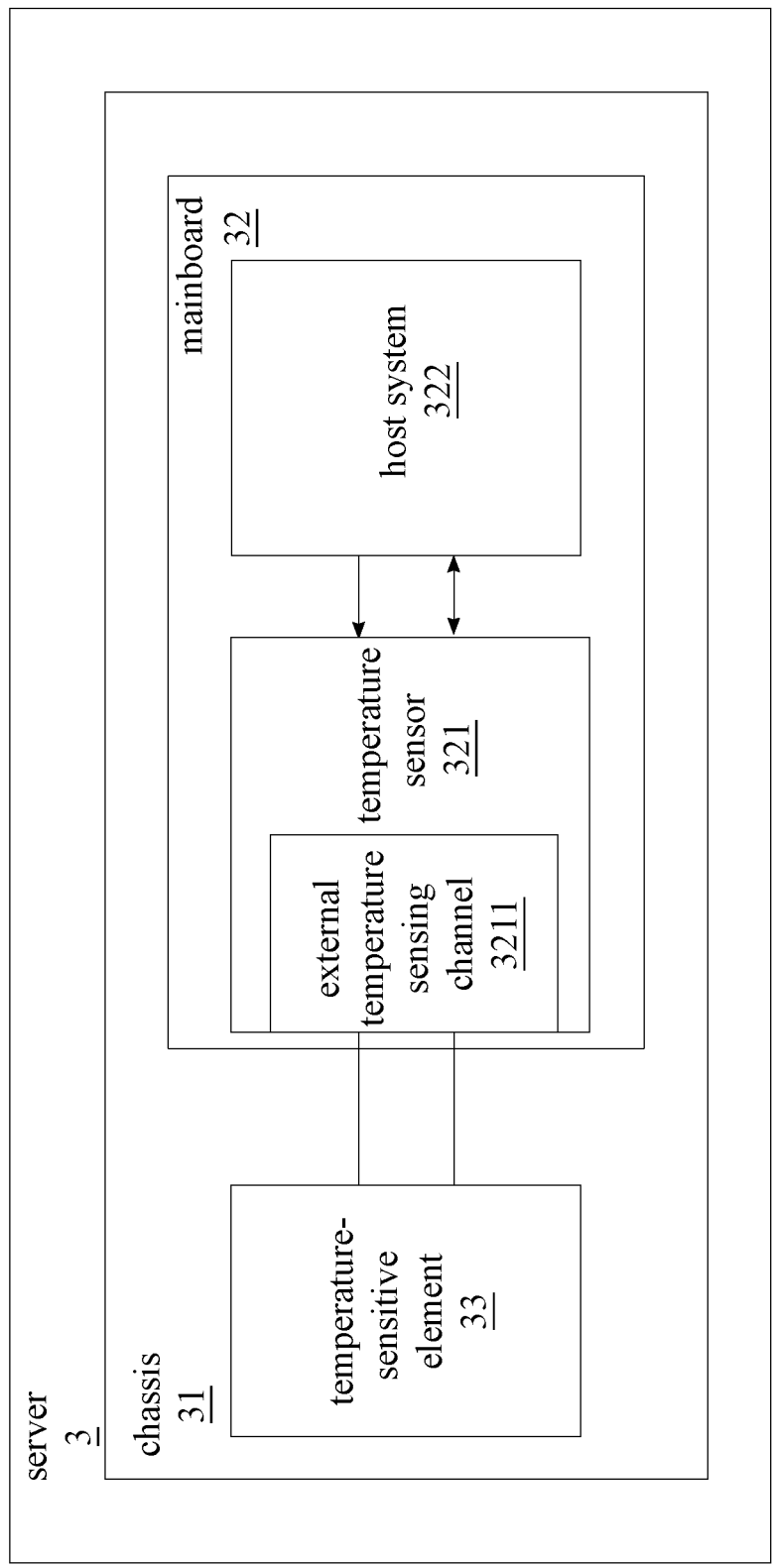
FIG. 3 is a principle structural diagram of a server according to one embodiment of the present disclosure.
Figure 4:
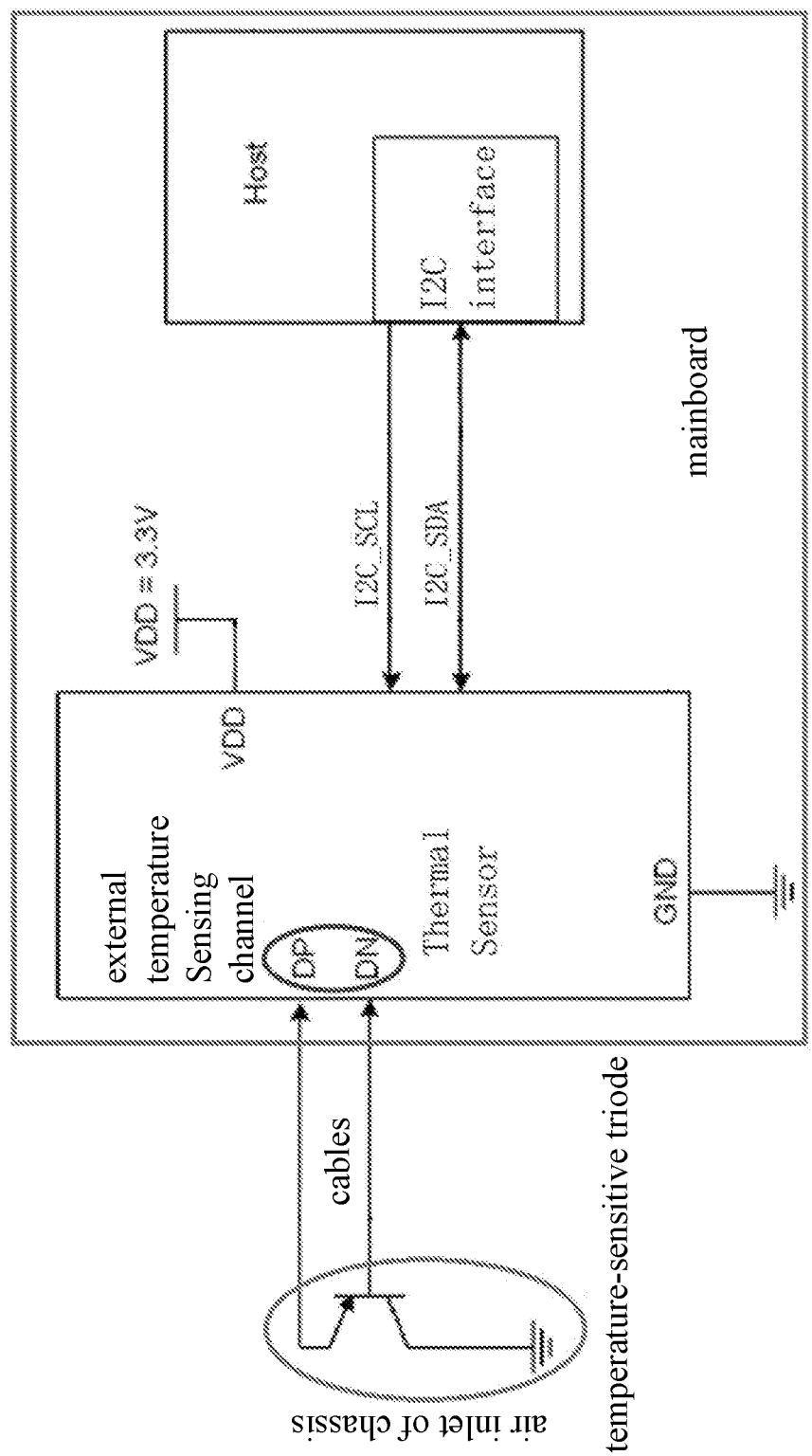
FIG. 4 is an implementation structural diagram of a server according to one embodiment of the present disclosure.

The server disclosed in this embodiment will be described in detail below with reference to drawings. Please refer to FIG. 3 and FIG. 4. FIG. 3 is a principle structural diagram of a server according to one embodiment of the present disclosure. FIG. 4 is an implementation structural diagram of a server according to one embodiment of the present disclosure. As shown in FIG. 3, the server 3 includes a chassis 31, a mainboard 32 and a temperature-sensitive element 33.

A temperature-sensitive element 33 is disposed at an inlet of a chassis 31. The temperature-sensitive element 33 is configured to convert temperature which is sensed at the inlet of the chassis inlet to temperature sensing data. Please continue to refer to FIG. 4, the temperature-sensitive element 33 includes a temperature-sensitive triode.

The mainboard 32 is disposed in the chassis 31. In this embodiment, the mainboard 32 includes a temperature sensor (e.g. a thermal sensor) 321 and a host system 322 which are integrated on the mainboard.

In this embodiment, an external temperature-sensing channel 3211 is disposed in the temperature sensor 321.

As shown in FIG. 4, the external temperature-sensing channel 3211 of the temperature sensor 321 includes a positive electrode interface DP and a negative electrode interface DN. The temperature sensor 321 further includes a power terminal VDD and a ground terminal GND. The power terminal VDD receives power which is provided by the mainboard 2 for the temperature sensor 11 (e.g. 3.3V). In this embodiment, the temperature sensor 321 obtains the temperature sensing data by detecting a voltage difference between the positive electrode interface and the negative electrode interface and converts the temperature sensing data to binary data.

In this embodiment, the host system 322 is communicatively connected to the temperature sensor via a I$^2$C interface and configured to analyze the binary data for obtaining a temperature value at the inlet of the chassis. In this embodiment, a testing department does not need to test the anode/cathode signals of the temperature-sensitive triode. The error value of the sensed temperature can be adjusted by an internal difference register of the temperature sensor, so labor costs can be reduced.

The temperature-sensitive element 33 disposed at the inlet of the chassis is communicatively connected to the external temperature-sensing channel 3211 of the temperature sensor 321. Specifically, the temperature-sensitive element 32 is communicatively connected to the external temperature-sensing channel 3211 of the temperature sensor 321 through cables. The cables include an anode signal line and a cathode signal line.

In this embodiment, the connection of the server 3 is shown below:

A collector C of the temperature-sensitive triode is grounded.

An emitter E of the temperature-sensitive triode is communicatively connected to the positive electrode interface DP. Specifically, the emitter E of the temperature-sensitive triode is connected to the positive electrode interface DP of the external temperature-sensing channel 3211 through the anode signal line.

A base B of the temperature-sensitive triode is communicatively connected to the negative electrode interface DN. Specifically, the base B of the temperature-sensitive triode is connected to the negative electrode interface DN of the external temperature-sensing channel 3211 through the cathode signal line.

The temperature sensor 321 is connected to the host system 322 through I$^2$C data lines.

In the server, the temperature sensor is disposed on the mainboard. With the external temperature-sensing channel of the temperature sensor, a temperature-sensitive triode is externally connected to the external temperature-sensing channel by using cables, and further the temperature-sensitive triode is disposed at the inlet of the chassis. Thereby, the function of sensing temperature at an inlet of a server chassis can be achieved, so that the product manufacturing costs are reduced. Furthermore, it is not necessary to test I$^2$C signals on a temperature sensor board, so that the labor costs are reduced.

In view of the above, the present disclosure effectively overcomes various defects of the conventional techniques and owns high values of industrial utilization.

The above embodiments merely illustrate the principle and effects of the present disclosure and is not intended to limit the present disclosure. Modifications or changes can be made on the embodiments by persons skilled in the art without departing from the spirit and the scope of the present disclosure. Therefore, all equivalent modifications or changes made by persons skilled in the art without departing from the spirit and the scope of the present disclosure should be considered as being covered by the scope of the present disclosure.

What is claimed is:

1. A temperature sensing device adapted to sense temperature at an inlet of a chassis, the temperature sensing device comprises:
    a temperature sensor disposed on a mainboard in the chassis; and
    a temperature-sensitive element disposed at the inlet of the chassis and communicatively connected to an external temperature-sensing channel of the temperature sensor, with the temperature-sensitive element configured to convert the temperature sensed at the inlet of the chassis to temperature sensing data and send the temperature sensing data to the temperature sensor.

2. The temperature sensing device according to claim 1, wherein the temperature-sensitive element is communicatively connected to the external temperature-sensing channel of the temperature sensor through cables.

3. The temperature sensing device according to claim 2 wherein the external temperature-sensing channel of the temperature sensor comprises a positive electrode interface and a negative electrode interface.

4. The temperature sensing device according to claim 3, wherein the temperature-sensitive element comprises a temperature-sensitive triode; a collector of the temperature-sensitive triode is grounded; an emitter of the temperature-sensitive triode is communicatively connected to the positive electrode interface; and a base of the temperature-sensitive triode is communicatively connected to the negative electrode interface.

5. The temperature sensing device according to claim 4, wherein the cables comprises an anode signal line and a cathode signal line; the emitter of the temperature-sensitive triode is communicatively connected to the positive electrode interface of the external temperature-sensing channel through the anode signal line; and the base of the temperature-sensitive triode is communicatively connected to the negative electrode interface of the external temperature-sensing channel through the cathode signal line.

6. The temperature sensing device according to claim 3, wherein the temperature sensor obtains the temperature sensing data by detecting a voltage difference between the positive electrode interface and the negative electrode interface and converts the temperature sensing data to binary data.

7. A server, comprises:
    a chassis, with a temperature-sensitive element disposed at an inlet of the chassis, the temperature-sensitive element configured to convert temperature sensed at the inlet of the chassis to temperature sensing data; and
    a mainboard disposed in the chassis, with the mainboard comprising a temperature sensor and a host system, an external temperature-sensing channel of the temperature sensor communicatively connected to the temperature-sensitive element for transferring the temperature sensing data to the host system.

8. The server according to claim 7, wherein the temperature-sensitive element is communicatively connected to the external temperature-sensing channel of the temperature sensor through cables; the external temperature-sensing channel of the temperature sensor comprises a positive electrode interface and a negative electrode interface; the cables comprises an anode signal line and a cathode signal line; the temperature-sensitive element comprises temperature-sensitive triode; an emitter of the temperature-sensitive triode is connected to the positive electrode interface of the external temperature-sensing channel through the anode signal line; and a base of the temperature-sensitive triode is connected to the negative electrode interface of the external temperature-sensing channel through the cathode signal line.

9. The server according to claim 8, wherein the temperature sensor obtains the temperature sensing data by detecting a voltage difference between the positive electrode interface and the negative electrode interface and converts the temperature sensing data to binary data.

10. The server according to claim 9, wherein the host system is communicatively connected to the temperature sensor via a I$^2$C interface and configured to analyze the binary data to obtain a temperature value of the inlet of the chassis.

* * * * *